(12) United States Patent
Lin et al.

(10) Patent No.: US 7,791,372 B2
(45) Date of Patent: Sep. 7, 2010

(54) LEVEL SHIFTER AND LEVEL SHIFTING METHOD THEREOF

(75) Inventors: Yung-Feng Lin, Taoyuan County (TW); Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 43 days.

(21) Appl. No.: 12/171,542

(22) Filed: Jul. 11, 2008

(65) Prior Publication Data

US 2010/0007380 A1  Jan. 14, 2010

(51) Int. Cl.
*H03K 19/0175* (2006.01)
(52) U.S. Cl. .............................. 326/81; 326/68; 326/83; 327/333; 327/434
(58) Field of Classification Search .................... 326/68, 326/81, 83; 327/333
See application file for complete search history.

(56) References Cited

U.S. PATENT DOCUMENTS

| | | | | |
|---|---|---|---|---|
| 5,808,482 A | * | 9/1998 | Rountree | 326/108 |
| 5,872,476 A | * | 2/1999 | Mihara et al. | 327/333 |
| 5,963,054 A | * | 10/1999 | Cochran et al. | 326/68 |
| 5,969,542 A | * | 10/1999 | Maley et al. | 326/81 |
| 6,011,421 A | * | 1/2000 | Jung | 327/333 |
| 6,064,229 A | * | 5/2000 | Morris | 326/81 |
| 6,768,368 B2 | * | 7/2004 | Kaneko et al. | 327/333 |
| 6,903,576 B2 | * | 6/2005 | Narwal | 326/68 |
| 7,180,329 B1 | * | 2/2007 | Sia et al. | 326/81 |
| 7,199,617 B1 | * | 4/2007 | Schrom et al. | 326/86 |

* cited by examiner

*Primary Examiner*—Vibol Tan
(74) *Attorney, Agent, or Firm*—Thomas, Kayden, Horstemeyer & Risley (57) ABSTRACT

A level shifter includes a first level-switching device and a second level-switching device. The first level-switching device includes a first switch device, a second switch device, a first control switch and a third switch device. The first switch device is for receiving the input voltage and outputting a first voltage. The second switch device is coupled to the first switch device for outputting a first operational voltage as the output voltage according to the first voltage. The first control switch is coupled to the first switch device for receiving the first voltage. The third switch device is coupled between the first control switch and the first operational voltage and controlled by the output voltage. The second level-switching device is coupled to the first level-switching device for receiving the input voltage and accordingly outputting a second operational voltage as the output voltage.

25 Claims, 7 Drawing Sheets

LEVEL SHIFTER AND LEVEL SHIFTING METHOD THEREOF

BACKGROUND OF THE INVENTION

1. Field of the Invention

The invention relates in general to a level shifter and level shifting method thereof, and more particularly to a level shifter of a non-volatile memory, which can ensure a normal operation of word-line selection and de-selection, and level shifting method thereof.

2. Description of the Related Art

Figure 1A:
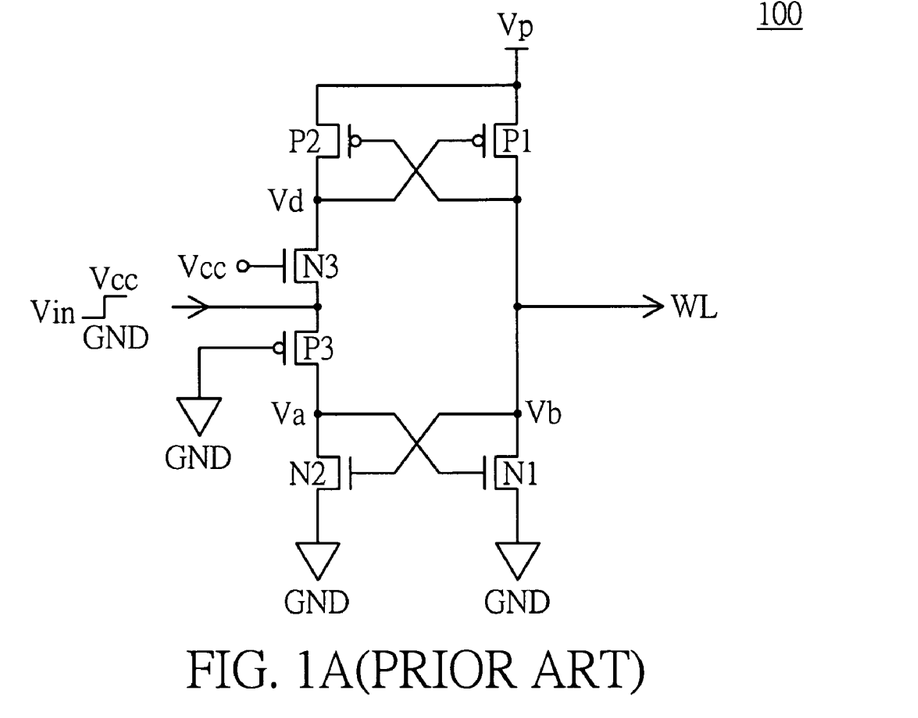
FIG. 1A illustrates a conventional level shifter used in an X-decoder of a non-volatile memory.

FIG. 1A illustrates a conventional level shifter used in an X-decoder of a non-volatile memory. The level shifter 100 includes P-type metal oxide semiconductor (PMOS) transistors P1~P3 and N-type metal oxide semiconductor (NMOS) transistors N1~N3. The transistors P3 and N3 are used for receiving an input voltage Vin (alternating between GND and Vcc, e.g. 2.5V) and the transistors P1 and N1 are respectively used for outputting the operational voltages Vp (e.g. 6V) and GND as an output voltage for selecting and de-selecting a word line WL.

When the input voltage Vin has the GND level, the transistors P3, N1 and N2 are turned off, and the transistor N3 is turned on to output the GND voltage. The transistor P1 is turned on by the GND voltage to output the operational voltage Vp as the output voltage for selecting the word line WL, and the transistor P2 is turned off by the output voltage.

Figure 1B:
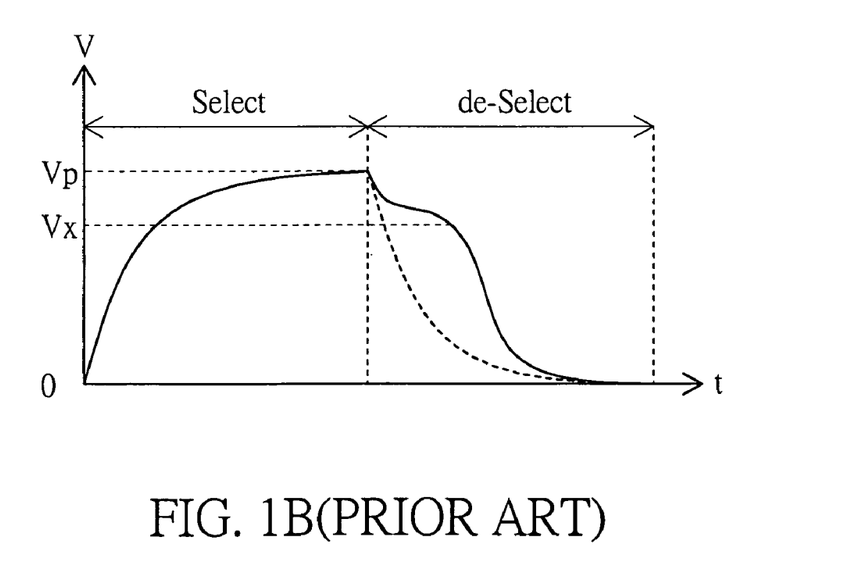
FIG. 1B is a diagram showing a failure operation in the WL de-select period of the level shifter of FIG. 1A.

When the input voltage Vin rises from the GND level to the Vcc level (e.g. 2.5V), the transistors N3, P1 and P2 are turned off, and the transistor P3 is turned on to lift up the source voltage Va toward Vcc. However, because the drain voltage Vb of the transistor N1 is still at the level Vp (e.g. 6V) immediately after the previous period, the transistor N2, controlled by the voltage Vb, will be partially turned on to lower down the source voltage Va of the transistor P3 toward GND, causing a fighting path between the turned-on transistors P3 and N2. As a result, the transistor N1, controlled by the source voltage Va of the transistor P3, is partially turned on to lower down the output voltage to only a level Vx between GND and Vp first instead of quickly dropping the output voltage to the GND level, as shown in FIG. 1B, thereby causing a failure of de-selecting the word line WL. Similarly, when the input voltage Vin drops from the Vcc level to the GND level in the following period, the output voltage will not quickly rise up to the voltage Vp level due to the fighting path between the turned-on transistors N3 and P2, also causing a failure of word-line selection.

One method for resolving the above issue is to adjust the source voltage Va of the transistor P3 (or the drain voltage Vd of the transistor N3) to approach the Vcc level so as to completely turn on the transistor N1 (or the transistor P1) to output the GND voltage (or Vp) in the de-selection (or selection) operation by increasing the resistance of the transistor N2 (or P2). However, increasing the resistance of the transistor N2 (or P2) will inevitably increase the length of the transistor N2 (or P2). Owing that there are normally 8,000 to 16,000 level shifters 100 used for selecting and de-selecting word lines WL in the non-volatile memory, even a small length increase of the transistor N2 (or P2) in the level shifter 100 will cause a great enlargement in the size of the X-decoder, which goes against the design tendency of the non-volatile memory to be thin and small.

Another prior art will lower the voltage of Vp in FIG. 1A from the high voltage, e.g. 6V to the Vcc level, e.g. 2.5V, and then perform pre-decoding switching. After the switching, the voltage Vp is raised from Vcc to the high voltage 6V. Although the scheme can avoid the above select/de-select problems, however, it will suffers from read speed loss.

SUMMARY OF THE INVENTION

The invention is directed to a level shifter and level shifting method thereof. By weakening down a current path between the input voltage and an operational voltage in a level-switching device of the level shifter such that the level-switching device outputs the operational voltage as an output voltage of the level shifter in the de-selection or selection operation, not only the failure of word-line de-selection or selection can be avoided, but also the voltage operation range of the level shifter and read speed of the memory can be improved.

According to a first aspect of the present invention, a level shifter is provided. The level shifter is applied in an integrated circuit (IC) for outputting an output voltage according to an input voltage. The level shifter comprises a first level-switching device and a second level-switching device. The first level-switching device comprises a first switch device, a second switch device, a first control switch and a third switch device. The first switch device is for receiving the input voltage and outputting a first voltage. The second switch device is coupled to the first switch device for outputting a first operational voltage as the output voltage according to the first voltage. The first control switch is coupled to the first switch device for receiving the first voltage. The third switch device is coupled between the first control switch and the first operational voltage and controlled by the output voltage. The second level-switching device is coupled to the first level-switching device for receiving the input voltage and accordingly outputting a second operational voltage as the output voltage.

According to a second aspect of the present invention, a level shifter is provided. The level shifter is applied in an IC for outputting an output voltage according to an input voltage. The level shifter includes a first level-switching device and a second level-switching device. The first level-switching device is for receiving the input voltage and accordingly outputting a first operational voltage as the output voltage. The first level-switching device includes a first control switch for weakening down a current path between the input voltage and the first operational voltage such that the first level-switching device outputs the first operational voltage. The second level-switching device is coupled to the first level-switching device for receiving the input voltage and accordingly outputting a second operational voltage as the output voltage.

According to a third aspect of the present invention, a level shifting method is provided. The level shifting method is applied in a level shifter for outputting a first operational voltage or a second operational voltage as an output voltage according to an input voltage. The level shifter comprises a first current path between the input voltage and the first operational voltage, and a switch device for outputting the first operational voltage. The level shifting method comprises when the input voltage changes from a first level to a second level, weakening down the first current path between the input voltage and the first operational voltage such that the switch device is turned on to output the first operational voltage as the output voltage.

The invention will become apparent from the following detailed description of the preferred but non-limiting embodiments. The following description is made with reference to the accompanying drawings.

DETAILED DESCRIPTION OF THE INVENTION

Embodiment One

Figure 2:
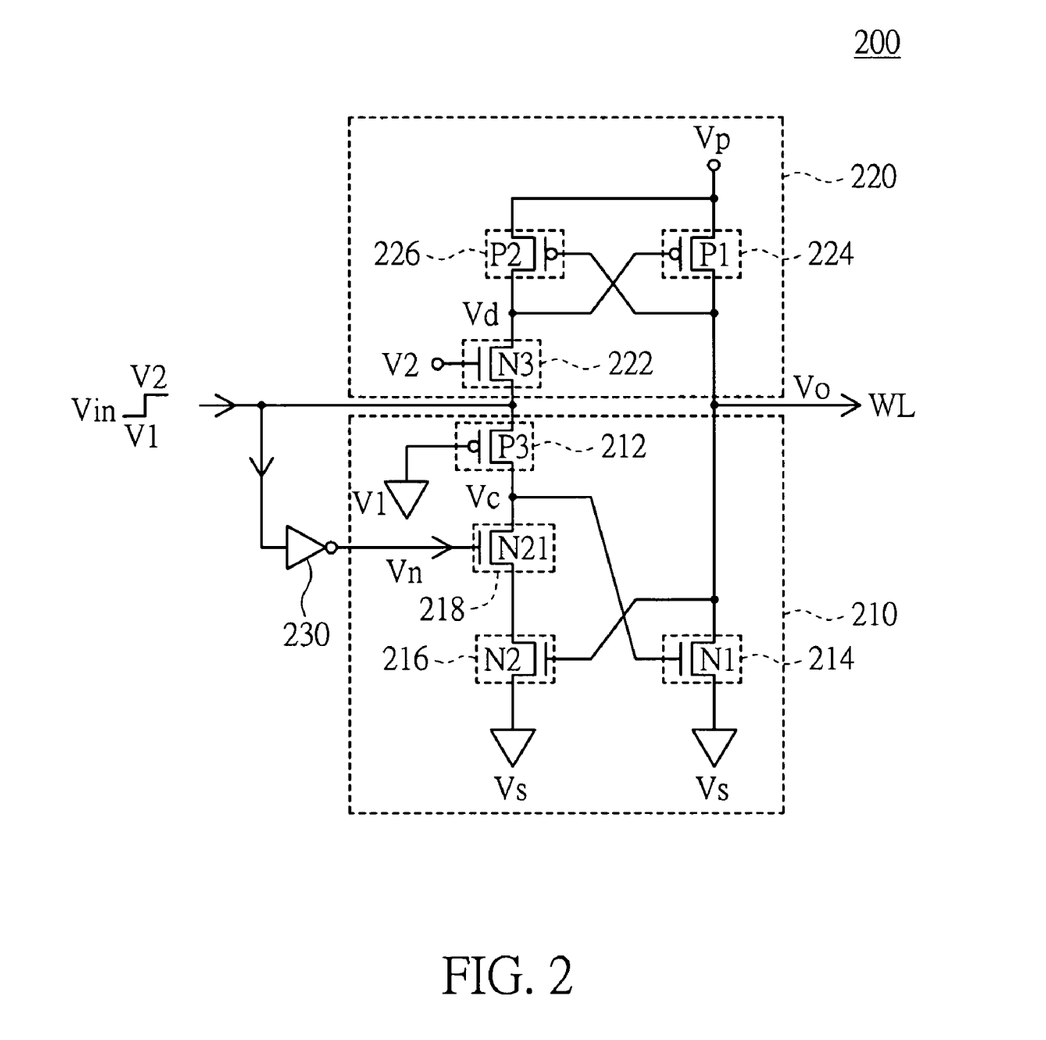
FIG. 2 is a circuit diagram of a level shifter according to a first embodiment of the invention.

Referring to FIG. 2, a circuit diagram of a level shifter according to a first embodiment of the invention is shown. The level shifter 200 is applied in an X-decoder of a non-volatile memory for outputting an output voltage Vo to a word line WL according to an input voltage Vin. The level shifter 200 includes a first level-switching device 210 and a second level-switching device 220 for receiving the input voltage Vin and outputting a first operational voltage Vs, such as 0V, and a second operational voltage Vp, such as 5V~8V, as the output voltage Vo to the word line WL, respectively. The level shifter 200 further includes an inverter 230 for receiving the input voltage Vin and outputting an inverted voltage Vn with a level inverted to the input voltage Vin.

The first level-switching device 210 includes a first switch device 212, a second switch device 214, a third switch device 216 and a first control switch 218. The first switch device 212, such as a PMOS transistor P3, is for receiving the input voltage Vin and outputting a first voltage Vc (i.e. the source voltage of P3) according to a voltage with a first level V1, such as 0V. The second switch device 214, such as a NMOS transistor N1, is coupled to the first switch device 212 for outputting the first operational voltage Vs, such as 0V, to be the output voltage Vo according to the first voltage Vc. The first control switch 218, such as a NMOS transistor N21, is coupled to the first switch device 212 for receiving the first voltage Vc and controlled by the inverted voltage Vn. The third switch device 216, such as a NMOS transistor N2, is coupled between the first control switch 218 and the first operational voltage Vs and controlled by the output voltage Vo.

The second level-switching device 220 includes a fourth switch device 222, a fifth switch device 224 and a sixth switch device 226. The fourth switch device 222, such as a NMOS transistor N3, is for receiving the input voltage Vin and outputting a second voltage Vd (i.e. the drain voltage of N3) according to a voltage with a second level V2, such as 2.5V~3V. The fifth switch device 224, such as a PMOS transistor P1, is coupled to the fourth switch device 222 for outputting the second operational voltage Vp (5V~8V) to be the output voltage Vo according to the second voltage Vd. The sixth switch device 226, such as a PMOS transistor P2, is coupled between the fourth switch device 222 and the second operational voltage Vp and controlled by the output voltage Vo.

When the input voltage Vin changes from the second level V2 (2.5V~3V) to the first level V1 (0V), in the first level-switching device 210, the first switch device 212 is turned off and the first voltage Vc is lowered down to the first operational voltage Vs (0V) due to a discharging path through the first control switch 218 and the third switch device 216 to turn off the second switch device 214. In the second level-switching device 220, the fourth switch device 222 is turned on to output the input voltage Vin with the first level V1 as the second voltage Vd. The fifth switch device 224 is then turned on by the second voltage Vd to output the second operational voltage Vp (5V~8V) as the output voltage Vo for selecting the word line WL.

When the input voltage Vin rises from the first level V1 (0V) to the second level V2 (2.5V~3V), in the second level-switching device 220, the fourth switch device 222 is turned off and the second voltage Vd is raised to the second operational voltage Vp (5V~8V) due to a charging path through the sixth switch device 226 to turn off the fifth switch device 224. In the first level-switching device 210, the first control switch 218 is turned off by the inverted voltage Vn (=0V) so that the first switch device 212 is completely turned on to output the input voltage Vin with the second level V2 as the first voltage Vc, and accordingly the second switch device 214 is completely turned on to output the first operational voltage Vs (0V) as the output voltage Vo for de-selecting the word line WL.

It is noted that in the case that the first operational voltage Vs, such as −1V, is lower than V1 (0V), the first control switch 218 is partially turned off by the inverted voltage Vn (0V) to weaken down the current path from the first switch device 212 to the first operational voltage Vs through the third switch device 216. Consequently, the first voltage Vc outputted by the first switch device 212 is close to the second level V2 such that the second switch device 214 is turned on to output a voltage close to the first operational voltage Vs as the output voltage Vo for de-selecting the word line WL.

Compared to the prior-art level shifter 100, the level shifter 200 of the first embodiment includes the first control switch 218 between the first switch device 212 and the third switch device 216, and weakens (or cuts) down the current path from the first switch device 212 to the first operational voltage Vs through the third switch device 216 during the period of word-line de-selection by turning off the first control switch 218. Therefore, the above fighting path between the turned-on first switch device 212 and third switch device 216 can be broken and thus the failure situation of word-line de-selection can be avoided. Not only the read speed of the non-volatile memory can be improved, but also the voltage operation range (from Vs to Vp) of the level shifter 200 can be increased since the level shifter 200 can be used to level-shift the input voltage Vin into the output voltage Vo with a higher positive operational voltage Vp, such as 8V.

Embodiment Two

Figure 3:
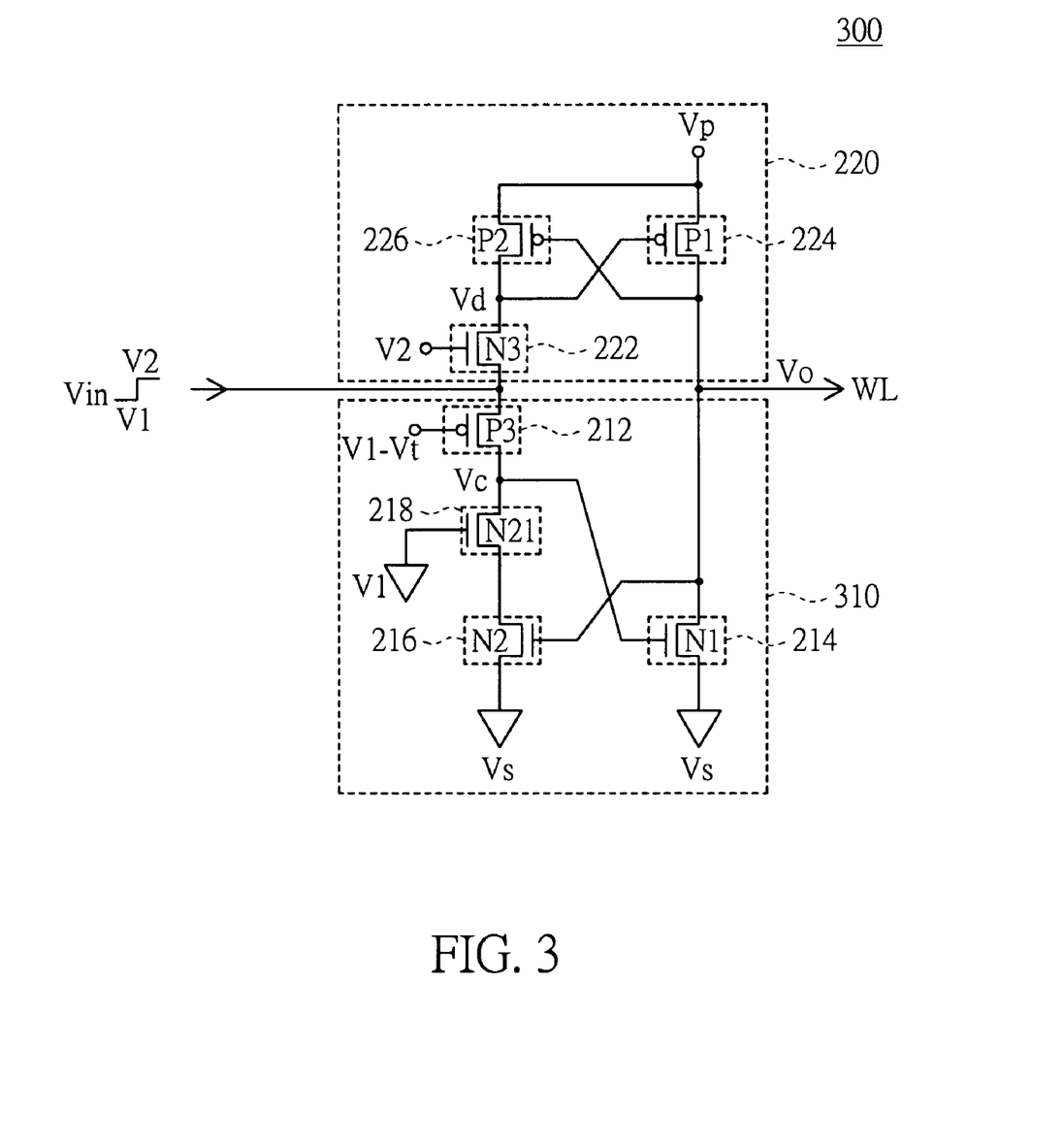
FIG. 3 is a circuit diagram of a level shifter according to a second embodiment of the invention.

Referring to FIG. 3, a circuit diagram of a level shifter according to a second embodiment of the invention is shown. Different from the level shifter 200 of the first embodiment, the level shifter 300 of the second embodiment includes a first level-switching device 310 and the second level-switching device 220 without using the inverter 230, the first control switch 218 of the first level-switching device 310 is controlled by a voltage with the first level V1 (=0V) and the first switch device 212 of the first level-switching device 310 is controlled by a voltage with the first level V1 (=0V) minus a threshold voltage Vt, such as 1V, of the first switch device 212 (the transistor P3).

Similar to the selection and de-selection situation of the level shifter 200, when the input voltage Vin drops from the second level V2 to the first level V1, the first switch device 212, the second switch device 214, the third switch device 216 and the first control switch 218 are all turned off, while the fourth switch device 222 and the fifth switch device 224 are turned on to output the second operational voltage Vp as the output voltage Vo for selecting the word line WL. When the input voltage Vin rises from the first level V1 to the second level V2, the fourth switch device 222, the fifth switch device 224 and the sixth switch device 226 are turned off, and the first control switch 218 is still turned off since the gate voltage of N21 is fixed at 0V. Therefore, the turned-on first switch device 212 outputs the first voltage Vc with the second level V2 to further turn on the second switch device 214 to output the first operational voltage Vs as the output voltage Vo, and the above fighting path between the turned-on first switch device 212 and third switch device 216 can be broken to avoid the failure of word-line de-selection. As a result, not only the voltage operation range of the level shifter 300 can be improved, but also the read speed of the non-volatile memory can be increased.

Embodiment Three

Figure 4:
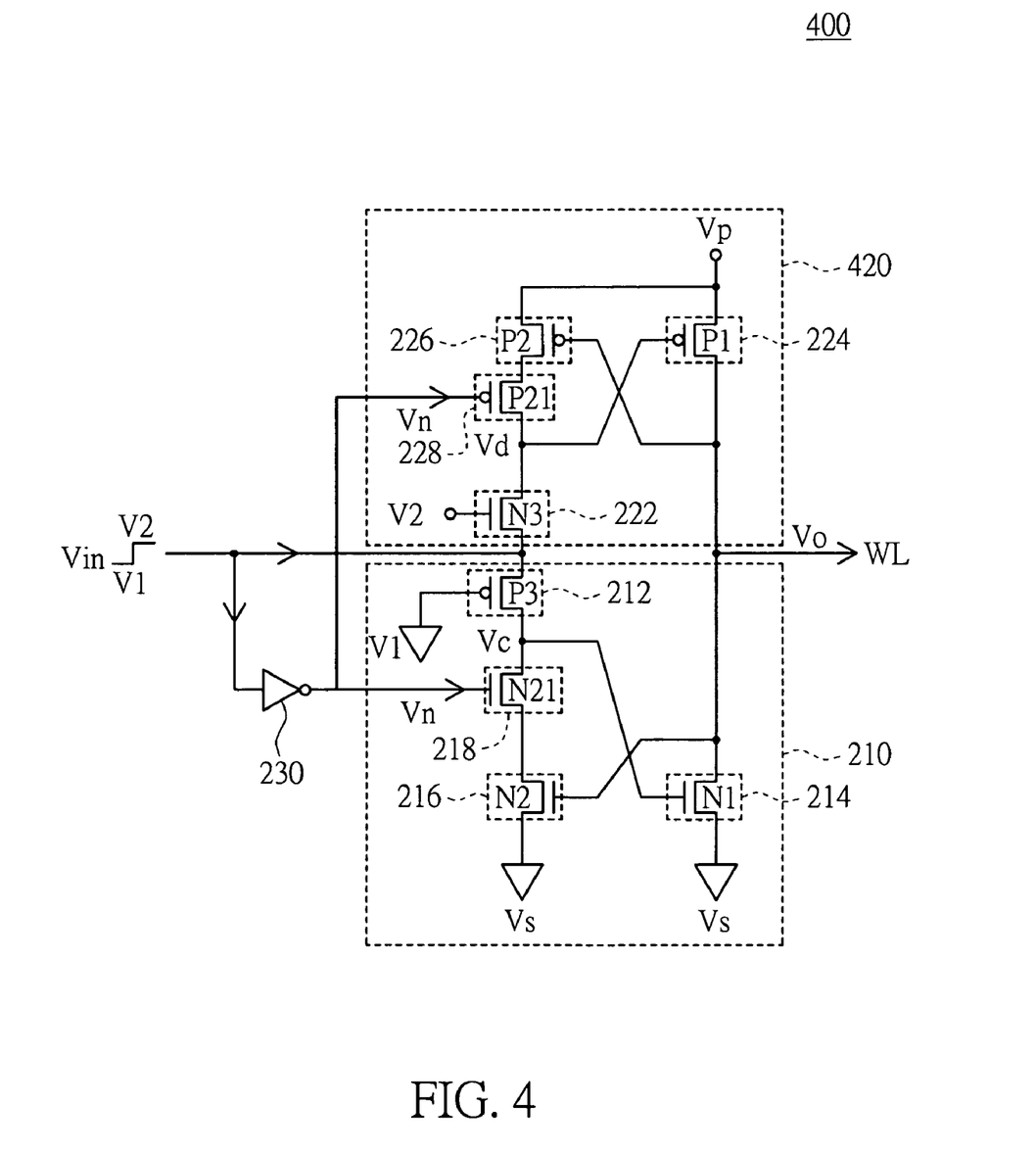
FIG. 4 is a circuit diagram of a level shifter according to a third embodiment of the invention.

Referring to FIG. 4, a circuit diagram of a level shifter according to a third embodiment of the invention is shown. Different from the level shifter 200 of the first embodiment, the level shifter 400 of the third embodiment further includes a second control switch 228, such as a PMOS transistor P21, coupled between the fourth switch device 222 and the sixth switch device 226 of the second level-switching device 420 and controlled by the inverted voltage Vn for receiving the second voltage Vd.

Similar to the de-selection situation of the level shifter 200, when the input voltage Vin rises from the first level V1 (0V) to the second level V2 (2.5V~3V), the fourth switch device 222 and the fifth switch device 224 are turned off, the first control switch 218 is turned off by the inverted voltage Vn (=0V) so that the first switch device 212 is completely turned on to output the input voltage Vin with the second level V2 (=2.5V~3V) to further completely turn on the second switch device 214 for outputting the first operational voltage Vc (0V). When the input voltage Vin drops from the second level V2 (2.5V~3V) to the first level V1 (0V), the first switch device 212 and the second switch device 214 are turned off and the second control switch 228 is turned off by the inverted voltage Vn (=2.5V~3V) so that the fourth switch device 222 is completely turned on to output the input voltage Vin with the first level V1 as the second voltage Vd, and accordingly the fifth switch device 224 is completely turned on to output the second operational voltage Vp as the output voltage Vo for selecting the word line WL. Therefore, the fighting path between the turned-on fourth switch device 222 and fifth switch device 224 can also be broken and thus the failure situation of word-line selection can be further avoided to improve the voltage operation range of the level shifter and increase the read speed of the non-volatile memory.

Embodiment Four

Figure 5:
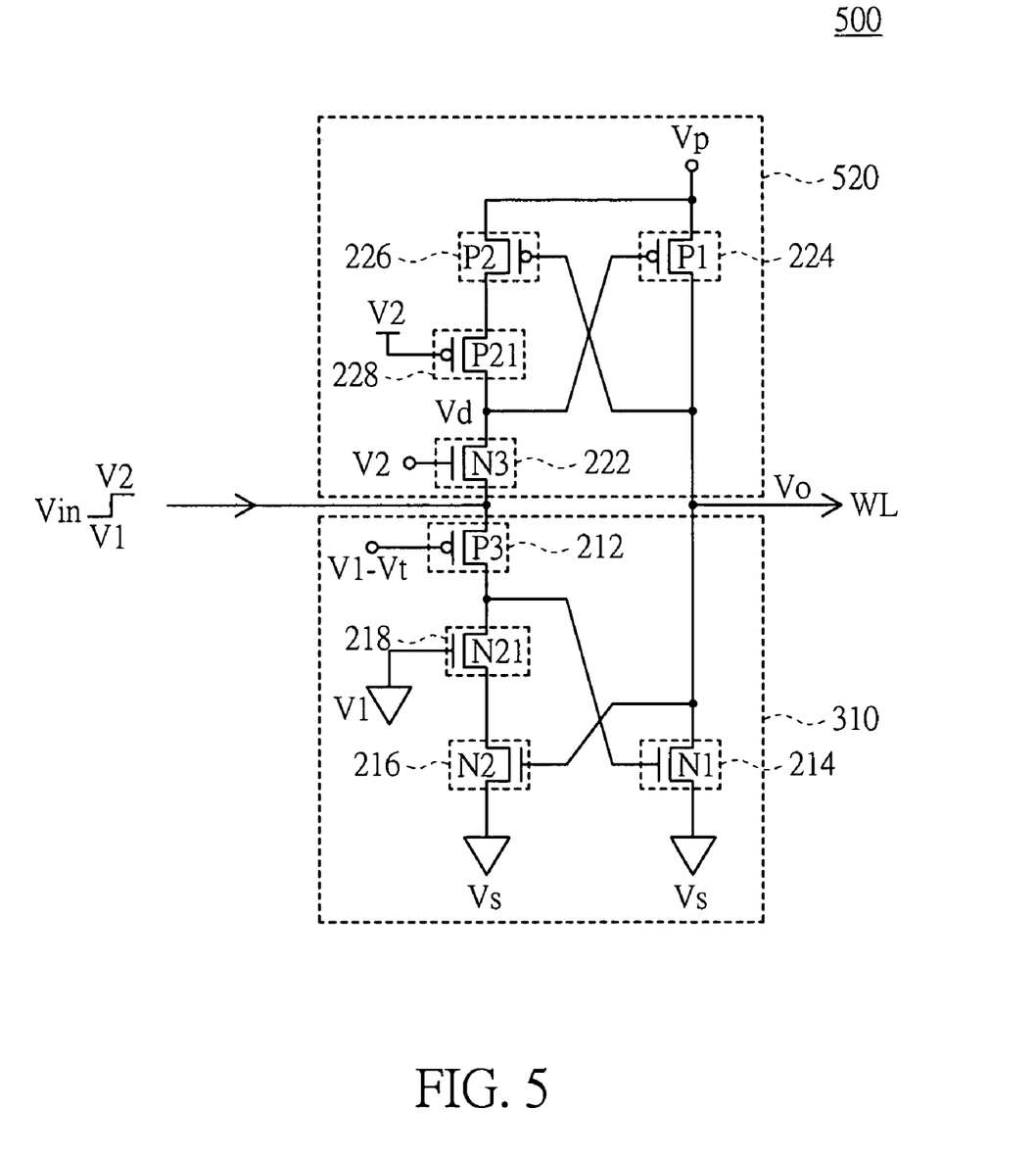
FIG. 5 is a circuit diagram of a level shifter according to a fourth embodiment of the invention.

Referring to FIG. 5, a circuit diagram of a level shifter according to a fourth embodiment of the invention is shown. Different from the level shifter 300 of the second embodiment, the level shifter 500 of the fourth embodiment further includes the second control switch 228, such as a PMOS transistor P21, coupled between the fourth switch device 222 and the sixth switch device 226 of the second level-switching device 520 and controlled by a voltage with the second level V2 for receiving the second voltage Vd.

Similar to the selection situation of the level shifter 400 and the de-selection situation of the level shifter 300, when the input voltage Vin drops from the second level V2 to the first level V1, the first switch device 212, the second switch device 214, the third switch device 216, the first control switch 218 are all turned off, while the second control switch 228 is turned off such that the fourth switch device 222 and the fifth switch device 224 are turned on to output the second operational voltage Vp as the output voltage Vo for selecting the word line WL. When the input voltage Vin rises from the first level V1 to the second level V2, the fourth switch device 222, the fifth switch device 224, the sixth switch device 226 and the second control switch 228 are turned off, and the first control switch 218 is still turned off since the gate voltage of N21 is fixed at 0V. Therefore, the current path from the first switch device 212 to the first operational voltage Vs through the third switch device 216 can be weakened or cut down and the above fighting path between the turned-on first switch device 212 and third switch device 216 can be broken to avoid the failure of word-line de-selection. As a result, not only the voltage operation range of the level shifter 300 can be improved, but also the read speed of the non-volatile memory can be increased.

Figure 6:
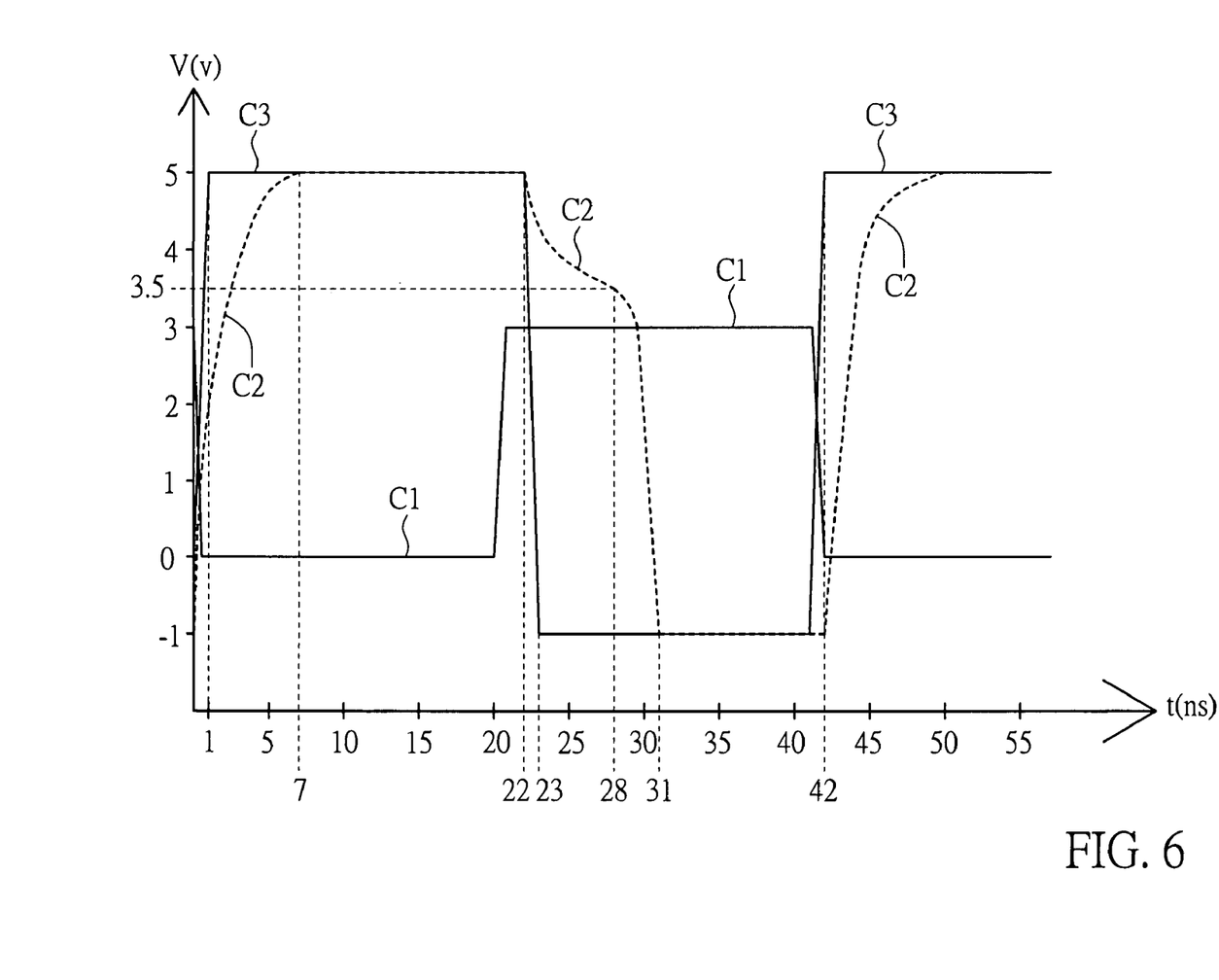
FIG. 6 is a simulation diagram of the output voltage Vo relative to time in the prior-art level shifter 200 and the level shifter 400 of the third embodiment with the input voltage Vin alternating between 0V and 3V and high and low operational voltages −1V and 5V.

Referring to FIG. 6, a simulation diagram of the output voltage Vo relative to time in the prior-art level shifter 100 and the level shifter 400 of the third embodiment with the input voltage Vin alternating between 0V and 3V and high and low operational voltages −1V and 5V is shown. As shown in FIG. 6, when the input voltage Vin drops from 3V to 0V (the curve C1) in the selection period, the output voltage Vo of the prior-art level shifter 100 rises from −1V to 5V spending a period of at least 7 ns (the curve C2), while the output voltage Vo of the level shifter 400 of the invention can quickly rise from −1V to 5V within a period of only 1 ns (the curve C3). When the input voltage Vin rises from 0V to 3V (the curve C1) in the following de-selection period, the output voltage Vo of the prior-art level shifter 100 drops from 5V to 3.5V first and then goes down to −1V totally spending a period of (31−22=9) ns (the curve C2). On the contrary, the output voltage Vo of the level shifter 400 of the invention quickly drops from 5V to −1V within only (23−22=1) ns. Therefore, the level shifter 400 of the invention can avoid the failure of word-line de-selection and selection and effectively reduce the discharging time of word-line de-selection and the charging time of word-line selection, as compared to the prior art.

Figure 7:
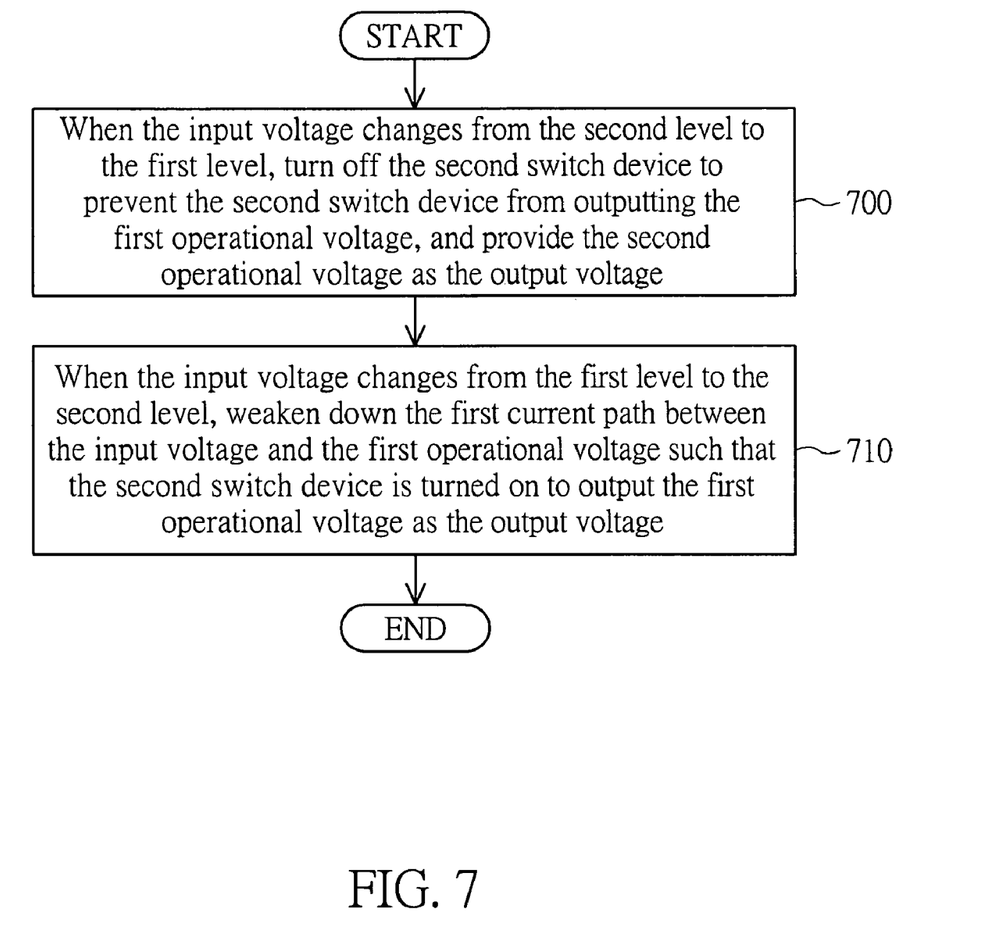
FIG. 7 is a flow chart of a level shifting method according to the invention.

Referring to FIG. 7, a flow chart of a level shifting method according to the invention is shown. The level shifting method is applied in a level shifter, such as the level shifter 200~500 for outputting the first operational voltage Vs (e.g. 0V) or the second operational voltage Vp (e.g. 5V~8V) as the output voltage Vo according to the input voltage Vin. The level shifter 200~500 includes a current path between the input voltage Vin and the first operational voltage Vs through the first switch device 212 and the third switch device 216, and the second switch device 214 for outputting the first operational voltage Vs as the output voltage Vo.

First, in step 700, when the input voltage Vin changes from the second level V2 (2.5V~3V) to the first level V1 (0V), turn off the second switch device 214 to prevent the second switch device from outputting the first operational voltage Vs, by turning off the first switch device 212 and discharging the first voltage Vc through the first control switch 218 and the third switch device 216, and provide the second operational voltage Vp as the output voltage Vo for selecting the word line WL.

Then, in step 710, when the input voltage Vin changes from the first level V1 (0V) to the second level V2 (2.5V~3V), weaken down the first current path between the input voltage Vin and the first operational voltage Vs by turning off the first control switch 218 such that the second switch device 214 can be turned on by the first voltage Vc equal to the input voltage Vin to output the first operational voltage Vs as the output voltage Vo for de-selecting the word line WL.

By weakening down the first current path between the input voltage Vin and the first operational Vs through the first switch device 212 and the third switch device 216, the second switch device 214 can be completely turned on by the input voltage Vin to output the first operational voltage Vs for de-selecting the word line WL. Therefore, the prior-art failure of word-line de-selection can be avoided to improve the voltage operation range of level shifting and the read operation of the non-volatile memory.

Although the level shifting method of the invention is exemplified to include the steps 700 and 710 as mentioned above, the step 700 can further include when the input voltage Vin changes from the second level V2 to the first level V1, weakening down a second current path between the input voltage Vin and the second operational voltage Vp such that the fifth switch device 224 can be turned on by the second voltage Vd equal to the input voltage Vin to output the second operational voltage Vp as the output voltage Vo for selecting the word line WL. The step 710 can further include turning off the fifth switch device 224 to prevent the fifth switch device 224 from outputting the second operational voltage Vp. As long as a current path between the input voltage Vin and the operational voltage Vs (or Vp) can be weakened down to turn on the switch device 216 (or 226) for outputting the operational voltage Vs (or Vp) to achieve the purpose of preventing failure of word-line de-selection and selection, any alternative will not depart from the scope of the invention.

The level shifter and level shifting method thereof disclosed by the above embodiments of the invention prevents the failure of word-line de-selection or selection by weakening down a current path between the input voltage Vin and the operational voltage Vs (or Vp) such that the switch device 214 (or 224) can output the operational voltage Vs (or Vp). Besides, the level shift of the invention can have larger driving ability to work in a larger voltage operation range, such as from Vs=-1V to Vp=8V, compared to the prior-art level shifter 100 working in a voltage operation range from Vs=-1V to only Vp=5V. The charging and discharging time is reduced during the word-line selection and de-selection, and thus the program, erase or read speed of the non-volatile memory can be effectively improved.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A level shifter, applied in an integrated circuit (IC) for outputting an output voltage according to an input voltage, the level shifter comprising:
   a first level-switching device, comprising:
      a first switch device, for receiving the input voltage and outputting a first voltage, wherein the first switch device is controlled by a constant voltage;
      a second switch device, coupled to the first switch device for outputting a first operational voltage as the output voltage according to the first voltage;
      a first control switch, coupled to the first switch device for receiving the first voltage; and
      a third switch device, coupled between the first control switch and the first operational voltage and controlled by the output voltage; and
   a second level-switching device, coupled to the first level-switching device for receiving the input voltage and accordingly outputting a second operational voltage as the output voltage.

2. The level shifter according to claim 1, wherein when the input voltage changes from a first level to a second level, the second level-switching device is turned off, and the first control switch is turned off so that the first switch device is turned on to output the first voltage, and accordingly the second switch device is turned on to output the first operational voltage as the output voltage.

3. The level shifter according to claim 2, wherein when the input voltage changes from the second level to the first level, the first switch device, the second switch device, the first control switch and the third switch device are all turned off, and the second level-switching device is turned on to output the second operational voltage as the output voltage.

4. The level shifter according to claim 2, wherein the first switch device is a P-type metal oxide semiconductor (PMOS) transistor, and the second switch device, the first control switch and the third switch device are N-type metal oxide semiconductor (NMOS) transistors.

5. The level shifter according to claim 4, wherein the constant voltage is a voltage with the first level minus a threshold voltage of the first switch device, and the first control switch is controlled by a voltage with the first level.

6. The level shifter according to claim 5, wherein the first level is 0V and the first switch device is controlled by a voltage -1V.

7. The level shifter according to claim 4, wherein the second level-switching device further comprises:
   a fourth switch device, for receiving the input voltage and outputting a second voltage;
   a fifth switch device, coupled to the fourth switch device for outputting the second operational voltage as the output voltage according to the second voltage; and
   a sixth switch device, coupled to the fourth switch device for outputting the second operational voltage according to the output voltage.

8. The level shifter according to claim 2, wherein the second level-switching device further comprises:
   a fourth switch device, for receiving the input voltage and outputting a second voltage;
   a fifth switch device, coupled to the fourth switch device for outputting the second operational voltage as the output voltage according to the second voltage;

a second control switch, coupled to the fourth switch device for receiving the second voltage; and a sixth switch device, coupled between the second control switch and a second voltage and controlled by the output voltage.

9. The level shifter according to claim 8, wherein when the input voltage changes from the first level to the second level, the fourth switch device and the fifth switch device are turned off, and when the input voltage changes from the second level to the first level, the second control switch is turned off so that the fourth switch device is turned on to output the second voltage with the first level, and accordingly the fifth switch device is turned on to output the second operational voltage as the output voltage.

10. The level shifter according to claim 9, wherein the fourth switch device is a NMOS transistor, and the fifth switch device, the second control switch and the sixth switch device are PMOS transistors.

11. The level shifter according to claim 10, further comprising an inverter for receiving the input voltage and outputting an inverted voltage, wherein the constant voltage is a voltage with the first level, the fourth switch device is controlled by a voltage with the second level, and the first control switch and the second control switch are controlled by the inverted voltage.

12. The level shifter according to claim 2, wherein the first level is 0V, the second level is 2.5V~3V, the first operational voltage is 0V, and the second operational voltage is 5V~8V.

13. The level shifter according to claim 1, wherein the level shifter is applied in an X-decoder of a non-volatile memory and the level shifter outputs the output voltage to a word line.

14. A level shifter, applied in an IC for outputting an output voltage according to an input voltage, the level shifter comprising:

a first level-switching device, for receiving the input voltage and accordingly outputting a first operational voltage as the output voltage, wherein the first level-switching device comprises:

a first switch device for receiving the input voltage and outputting a first voltage, wherein the first switch device is controlled by a constant voltage; and a first control switch receiving the first voltage for weakening down a current path between the input voltage and the first operational voltage such that the first level-switching device outputs the first operational voltage; and a second level-switching device, coupled to the first level-switching device for receiving the input voltage and accordingly outputting a second operational voltage as the output voltage.

15. The level shifter according to claim 14, wherein the first level-switching device comprises:

a second switch device, coupled to the first switch device for outputting the first operational voltage as the output voltage according to the first voltage; and a third switch device, coupled between the first control switch and the first operational voltage.

16. The level shifter according to claim 15, wherein when the input voltage changes from a first level to a second level, the second level-switching device is turned off, and the first control switch is turned off so that the first switch device is turned on to output the first voltage, and accordingly the second switch device is turned on to output the first operational voltage as the output voltage.

17. The level shifter according to claim 16, wherein when the input voltage changes from the second level to the first level, the first switch device, the second switch device, the first control switch and the third switch device are all turned off, and the second level-switching device is turned on to output the second operational voltage as the output voltage.

18. The level shifter according to claim 16, wherein the first switch device is a PMOS transistor, and the second switch device, the first control switch and the third switch device are NMOS transistors.

19. The level shifter according to claim 18, wherein the first switch device is controlled by a voltage with the first level minus a threshold voltage of the first switch device, and the first control switch is controlled by a voltage with the first level.

20. The level shifter according to claim 16, wherein the second level-switching device further comprises:

a fourth switch device, for receiving the input voltage and outputting a second voltage;

a fifth switch device, coupled to the fourth switch device for outputting the second operational voltage as the output voltage according to the second voltage;

a second control switch, coupled to the fourth switch device for receiving the second voltage; and a sixth switch device, coupled between the second control switch and a second voltage.

21. The level shifter according to claim 20, wherein when the input voltage changes from the first level to the second level, the fourth switch device and the fifth switch device are turned off, and when the input voltage changes from the second level to the first level, the second control switch is turned off so that the fourth switch device is turned on to output the second voltage with the first level, and accordingly the fifth switch device is turned on to output the second operational voltage as the output voltage.

22. The level shifter according to claim 21, further comprising an inverter for receiving the input voltage and outputting an inverted voltage, wherein the first switch device is controlled by a voltage with the first level, the fourth switch device is controlled by a voltage with the second level, and the first control switch and the second control switch are controlled by the inverted voltage.

23. A level shifting method, applied in a level shifter for outputting a first operational voltage or a second operational voltage as an output voltage according to an input voltage, the level shifter comprising a first current path between the input voltage and the first operational voltage, a first switch device for receiving the input voltage, and a second switch device for outputting the first operational voltage, wherein the first switch device is controlled by a constant voltage, the level shifting method comprising:

when the input voltage changes from a first level to a second level, weakening down the first current path between the input voltage and the first operational voltage such that the input voltage is provided to turn on the second switch device to output the first operational voltage as the output voltage.

24. The level shifting method according to claim 23, further comprising when the input voltage changes from the second level to the first level, turning off the second switch device to prevent the second switch device from outputting the first operational voltage, and providing the second operational voltage as the output voltage.

25. The level shifting method according to claim 24, wherein the level shifter further comprises a second current path between the input voltage and the second operational voltage, and another switch device for outputting the second operational voltage, and the level shifting method further comprises:

when the input voltage changes from the first level to the second level, turning off the another switch device to prevent the another switch device from outputting the second operational voltage; and when the input voltage changes from the second level to the first level, weakening down the second current path between the input voltage and the second operational voltage such that the another switch device can be turned on to output the second operational voltage as the output voltage.

* * * * *